United States Patent
Wu et al.

(10) Patent No.: US 10,566,237 B2
(45) Date of Patent: Feb. 18, 2020

(54) PROFILE OF THROUGH VIA PROTRUSION IN 3DIC INTERCONNECT

(71) Applicant: Taiwan Semiconductor Manufacturing Company, Ltd., Hsinchu (TW)

(72) Inventors: Jiung Wu, Kueishan Shiang (TW); Kuan-Liang Lai, Tainan (TW); Ming-Tsu Chung, Hsinchu (TW); Hong-Ye Shih, New Taipei (TW); Ku-Feng Yang, Baoshan Township (TW); Tsang-Jiuh Wu, Hsinchu (TW); Wen-Chih Chiou, Zhunan Township (TW); Shin-Puu Jeng, Hsinchu (TW); Chen-Hua Yu, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 16/227,928

(22) Filed: Dec. 20, 2018

(65) Prior Publication Data

US 2019/0122927 A1    Apr. 25, 2019

Related U.S. Application Data

(62) Division of application No. 14/263,466, filed on Apr. 28, 2014, now Pat. No. 10,163,705.

(51) Int. Cl.
*H01L 23/48*     (2006.01)
*H01L 23/52*     (2006.01)
*H01L 21/30*     (2006.01)
*H01L 21/768*    (2006.01)
*H01L 21/306*    (2006.01)

(52) U.S. Cl.
CPC .. *H01L 21/76898* (2013.01); *H01L 21/30625* (2013.01)

(58) Field of Classification Search
CPC ........... H01L 2224/94; H01L 21/76898; H01L 23/481
See application file for complete search history.

(56) References Cited

U.S. PATENT DOCUMENTS

| | | | |
|---|---|---|---|
| 7,214,615 B2 | 5/2007 | Miyazawa | |
| 7,358,602 B2 | 4/2008 | Hara | |
| 8,232,200 B1 | 7/2012 | Oh et al. | |
| 9,006,866 B2 | 4/2015 | Lee | |
| 2003/0022483 A1 | 1/2003 | Shroff et al. | |
| 2010/0038800 A1* | 2/2010 | Yoon | H01L 21/76898 257/774 |
| 2011/0133333 A1* | 6/2011 | Kwon | H01L 21/76898 257/737 |
| 2012/0133041 A1* | 5/2012 | Phee | H01L 21/76898 257/737 |

(Continued)

*Primary Examiner* — Bradley Smith
*Assistant Examiner* — David J Goodwin
(74) *Attorney, Agent, or Firm* — Slater Matsil, LLP (57) ABSTRACT

An interconnect structure for an integrated circuit, such as a three dimensional integrated circuit (3DIC), and a method of forming the same is provided. An example interconnect structure includes a substrate, a through via extending through the substrate, and a liner disposed between the substrate and the through via. The substrate includes a tapered profile portion. The tapered profile portion abuts the liner.

20 Claims, 4 Drawing Sheets

(56) References Cited

U.S. PATENT DOCUMENTS

| | | | |
|---|---|---|---|
| 2012/0235296 A1* | 9/2012 | West | H01L 23/481 |
| | | | 257/737 |
| 2013/0026606 A1 | 1/2013 | Farooq et al. | |
| 2013/0069227 A1* | 3/2013 | Lin | H01L 21/486 |
| | | | 257/737 |
| 2013/0252416 A1 | 9/2013 | Takeda et al. | |
| 2014/0048938 A1* | 2/2014 | Lee | H01L 23/5384 |
| | | | 257/751 |
| 2014/0327132 A1* | 11/2014 | Zhang | H01L 24/11 |
| | | | 257/737 |
| 2015/0028494 A1 | 1/2015 | Park et al. | |
| 2015/0228494 A1 | 8/2015 | Burghout et al. | |

* cited by examiner

PROFILE OF THROUGH VIA PROTRUSION IN 3DIC INTERCONNECT

PRIORITY CLAIM AND CROSS-REFERENCE

This application is a division of U.S. application Ser. No. 14/263,466, filed on Apr. 28, 2014, entitled "Profile of Through Via Protrusion in 3DIC Interconnect," which application is hereby incorporated herein by reference.

BACKGROUND

As the demand for smaller electronic products grows, manufacturers and others in the electronics industry continually seek ways to reduce the size of integrated circuits used in the electronic products. In that regard, three-dimensional type integrated circuit (3DIC) packaging techniques have been developed and used.

A beneficial technology for three-dimensional (3D) integration employs vertical interconnects known as a through via (TV). The through is a vertical electrical connection generally passing completely through a substrate, such as a silicon wafer, a die, or an interposer.

By using through via technology, 3D ICs can pack a great deal of functionality into a small "footprint." In addition, electrical paths through the device can be drastically shortened, leading to faster operation.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure will be described with respect to embodiments in a specific context, namely, an interconnect structure for a three dimensional integrated circuit (3DIC). The concepts in the disclosure may also apply, however, to other semiconductor structures or circuits. It should also be recognized by those skilled in the art that other structures and layers may be included in the interconnect structure 10 in practical applications.

Figure 1:
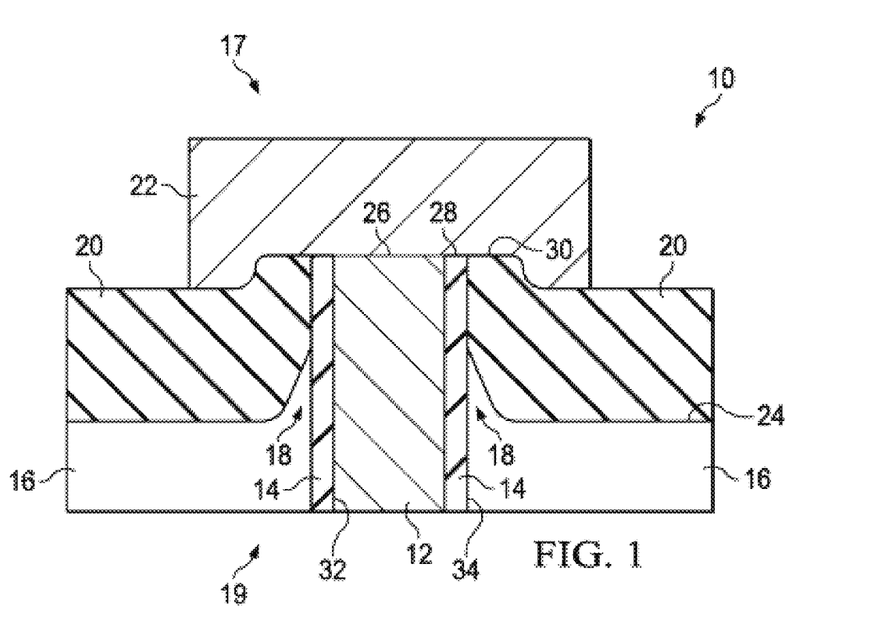
FIG. 1 illustrates an interconnect structure including a substrate with a tapered profile portion in accordance with some embodiments.

Referring now to FIG. 1, an embodiment interconnect structure 10 for a three dimensional integrated circuit is illustrated. As shown, the interconnect structure 10 includes a substrate 16 having a through via (TV) 12 extending therethrough, a liner 14, a dielectric capping layer 20, and a redistribution layer 22. The substrate 16 includes a tapered profile portion 18.

The substrate 16 abuts a portion of the liner 14. In an embodiment, the substrate 16 surrounds or encircles the liner 14 and the through via 12. The backside surface 24 of the substrate 16 is disposed below the backside surface 26 of the through via 12 such that sidewalls of the through via 12 and/or the liner 14 are exposed. In an embodiment, the substrate 16 may be made of a semiconductor material such as silicon, bulk silicon (doped or undoped), germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate 16 may be a silicon-on-insulator (SOI) substrate. Generally, an SOI substrate includes a layer of a semiconductor material such as epitaxial silicon, germanium, silicon germanium, SOI, silicon germanium on insulator (SGOI), or combinations thereof. Other substrates that may be used include multi-layered substrates, gradient substrates, or hybrid orientation substrates.

The through via 12 extends vertically through the substrate 16. Therefore, the through via 12 provides a conductive pathway through the substrate 16 from a backside 17 of the substrate 16 to a frontside 19 of the substrate 16. Although not shown in FIG. 1, integrated circuits, metallization, active or passive devices, an interlevel dielectric layer or layers, or an intermetal dielectric layer or layers may be formed in or over the frontside 19. In addition, in accordance with some embodiments the through via may extend through the interlevel dielectric layer or layers or the intermetal dielectric layer or layers (not shown) disposed over the frontside 19.

In accordance with some embodiments, the through via 12 is a through substrate via (TSV). In an embodiment, a portion of the through via 12 projects above a backside surface 24 of the substrate 16. In an embodiment, a backside surface 26 of the through via 12 is co-planar with a backside surface 28 of the liner 14 and/or a backside surface 30 of a portion of the dielectric capping layer 20.

The through via 12 is formed from a conductive metal. In an embodiment, the through via 12 is made from copper (Cu) or another metal suitable for use in an integrated circuit. The through via 12 is electrically coupled to the redistribution layer 22.

In some embodiments, the liner 14 is interposed between the through via 12 and the substrate 16. The liner 14 electrically isolates the through via 12 from the substrate 16. In an embodiment, the liner 14 is made from a dielectric material such as silicon nitride, silicon oxynitride, silicon carbide, or another suitable dielectric material.

The substrate 16 includes the tapered profile portion 18 abutting the through via 12 and/or the liner 14. The tapered profile portion 18 of the substrate 16 curves or angles upwardly (as oriented in FIGS. 1-2) as the tapered profile portion 18 approaches the through via 12. In other words, the backside surface 24 of the substrate 16 transitions from a horizontal orientation toward a vertical orientation as the substrate 16 approaches the liner 14 and the through via 12.

Figure 2:
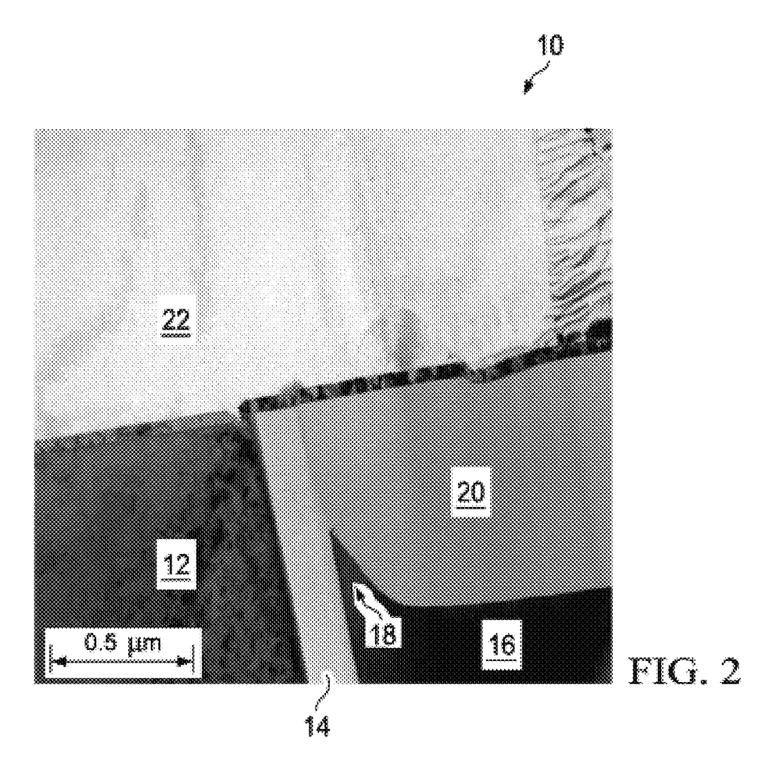
FIG. 2 illustrates an electrograph of a portion of the interconnect structure of FIG. 1 in accordance with some embodiments.

While the exterior surface of the tapered profile portion 18 is depicted as curved or arcuate in FIGS. 1-2, the exterior surface of the tapered profile portion 18 may also be linear, yet angled upwardly (as oriented in FIGS. 1-2), in some embodiments. In addition, in an embodiment the tapered profile portion 18 may comprise both curved and linear, yet upwardly angled (as oriented in FIGS. 1-2), portions. In an embodiment, the tapered profile portion 18 may also be stepped or terraced, convex, concave, and the like.

In an embodiment, a width of the tapered profile portion 18 increases as the tapered profile portion 18 extends further away from the liner 14. In other words, a width of an apex of the tapered profile portion 18 is less than a width of a base (or bottom) of the tapered profile portion 18. In addition, an overall thickness of the substrate 16 adjacent to the liner 14 is greater than the overall thickness of the substrate further away from the liner 14 due to the presence of the tapered profile portion 18.

The dielectric capping layer 20 is disposed over the substrate 16. In accordance with some embodiments, the entire backside surface of the substrate 16, including the tapered profile portion 18, is covered. As shown, the dielectric capping layer 20 engages a portion of the liner 14. In an embodiment, the dielectric capping layer 20 is made from silicon nitride, silicon oxide, or another suitable insulator. In an embodiment, the backside surface 30 of the dielectric capping layer 20 adjacent to the liner 14 is co-planar with the backside surface 26 of the through via 12. In an embodiment, a thickness of the capping layer 20 may be between about 700 nm and about 2000 nm.

The tapered profile portion 18 in the interconnect structure 10 reduces or prevents seams (i.e., leakage paths) extending through the dielectric capping layer 20. Therefore, the redistribution layer 22 and the substrate 16 remain electrically isolated from each other, particularly where the through via 12 protrudes from the substrate 16.

The redistribution layer 22 is electrically coupled to the through via 12. In an embodiment, the redistribution layer 22 extends laterally over the liner 14 and a portion of the dielectric capping layer 20. In an embodiment, the redistribution layer 22 may be horizontally oriented or extend laterally further than the through via 12. Therefore, the redistribution layer 22 caps or covers a portion of the through via 12.

Figure 3:
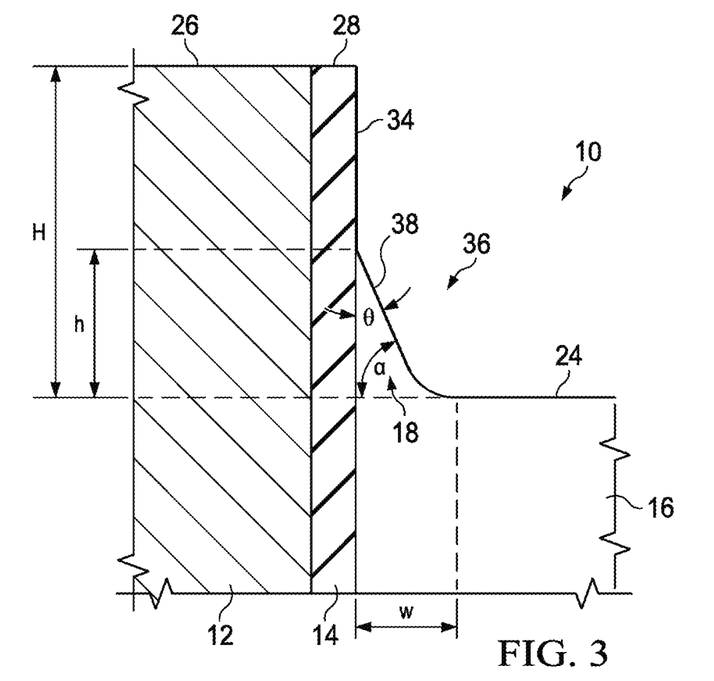
FIG. 3 illustrates a representative portion of the interconnect structure of FIG. 1 with various dimension lines in accordance with some embodiments.

Referring now to FIG. 3, a representative portion of the interconnect structure 10 of FIG. 1 is shown with various dimension lines. In an embodiment, a height h of the tapered profile portion 18 measured from the horizontal portion of the backside surface 24 of the substrate 16 to an apex 38 of the tapered profile portion 18 is greater than or about forty percent of a height H of the liner 14 measured from the horizontal portion of the backside surface 24 of the substrate 16 to the backside surface 28 of the liner 14. A tapered profile portion 18 having a height h greater than about 40% of a height H of the liner 14 generates a more favorable geometry for the subsequent capping of the dielectric layer 20, hence helping eliminate the formation of seams.

In an embodiment, an angle θ formed by the sidewall 34 of the liner 14 and an exterior surface 38 of the tapered profile portion 18 is greater than or about thirty degrees. In an embodiment, an angle α formed by the exterior surface 38 of the tapered profile portion 18 and the horizontal portion of the backside surface 24 of the substrate 16 is less than or about sixty degrees. The range of angle θ and α of the tapered profile portion 18 generates a more favorable geometry for the subsequent capping of dielectric layer 20, hence helping eliminate the formation of seams.

In an embodiment, the height h of the tapered profile portion 18 of the substrate 16, which is measured from the horizontal backside surface 24 of the substrate 16 to the apex of the tapered profile portion 18, is between about 300 nm and about 800 nm. In addition, in an embodiment the width w of the tapered profile portion 18, measured at the base, is between about 200 nm and about 800 nm.

Figure 4A:
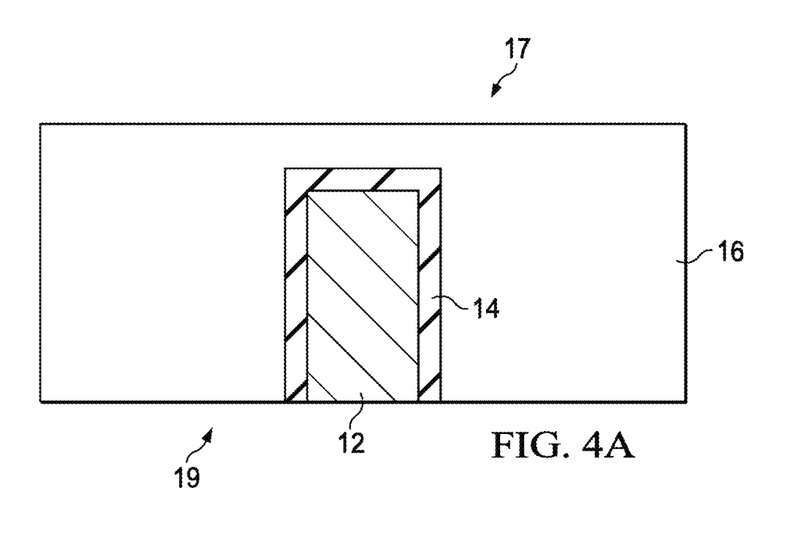
FIGS. 4A-4F collectively illustrate a method of forming the interconnect structure of FIG. 1 in some embodiments.

Referring collectively to FIGS. 4A-4F, a method of forming the interconnect structure of FIG. 1 is illustrated. In FIG. 4A, the through via 12 and the liner 14 have been formed in the substrate 16. In accordance with some embodiments, through via 12 in FIG. 4A is produced by forming an opening in the front side of the substrate 16. In some embodiments, the opening is formed using a photolithography process. In such process, a hard mask is deposited over the substrate 16. Then, a photoresist (PR) is deposited over the hard mask. Next, the photo resist is developed to provide a patterned hard mask. Once the hard mask has been patterned, an etch process is performed to etch the hard mask according to the pattern. Thereafter, the substrate 16 is etched using the etched hard mask. Next, any remaining hard mask material is removed to leave only the opening in the substrate 16.

In order to form the liner 14, an oxide layer is formed over the substrate 16 and the bottom and sidewalls of the opening. The oxide layer may be deposited using, for example, through Chemical Vapor Deposition (CVD), which may be Plasma Enhance CVD (PECVD), Atomic Layer Deposition (ALD), or the like. After the oxide layer has been formed, the portions of the oxide layer outside the opening (e.g., over the top surface of the substrate 16 laterally adjacent to the opening) may be removed by, for example, a CMP process to form the liner 14. In an embodiment, a thickness of liner 14 may be between about 100 nm and about 1000 nm. It is appreciated, however, that the values recited throughout the description are merely examples, and may be changed to different values.

To form the through via 12, the lined opening in the substrate 16 is filled with a conductive material (e.g., copper, copper alloy, or another suitable metal). In some embodiments, a seed layer may be deposited over the substrate 16 and the bottom and sidewalls of the liner 14. An electroplating process may be performed to fill the opening with the conductive material. Thereafter, a CMP process may be performed to remove the protective layer and portions of the conductive material disposed outside the opening to generate the through via 12. It should be recognized that other processes may be used to form the through via 12. Indeed, other methods and structures may be used in the process. For example, the through via technique may encompass drilling holes in the wafer by etching or laser and then filling the holes with conductive materials, such as copper, polysilicon, or tungsten to form the vias.

Figure 4B:
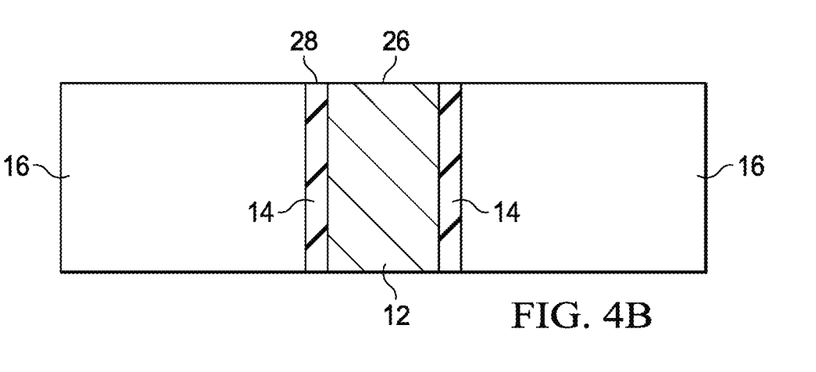

In FIG. 4B, a grinding or planarization process is performed to remove a portion of the substrate 16 and the liner 14. By removing the portion of the substrate 16 and the liner 14, the backside surface 26 of the through via 12 and the backside surface 28 of the liner 14 are exposed.

Figure 4C:
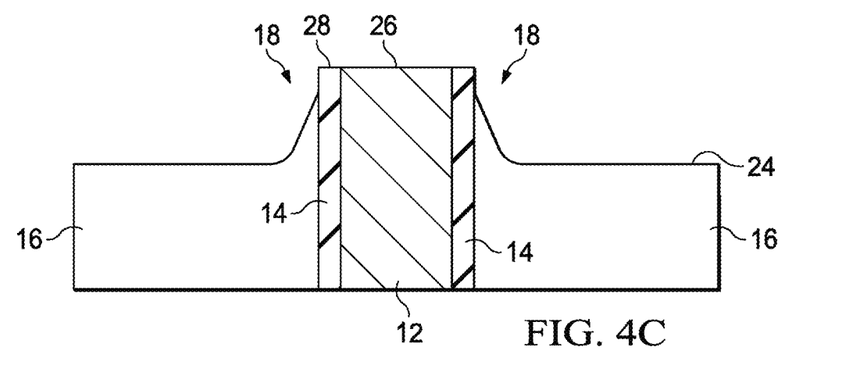

In FIG. 4C, the substrate 16 is subjected to a selective planarization process to generate the tapered profile portion 18. In an embodiment, the selective planarization process is a chemical mechanical polishing (CMP) process. In an embodiment, the selective process utilizes a CMP slurry with a high etch rate selectivity between the material of the substrate and the through via. For example, in an embodiment which the substrate is silicon and the conductive material is copper, the CMP slurry has a very high silicon-to-copper selectivity (e.g., the CMP slurry has a high silicon polishing rate and a lower copper polishing rate) combined with a polishing pad configured to be relatively compliant or soft to the topography to generate the tapered profile portion 18.

In some embodiments, the polishing rate of the substrate 16 around the through silicon via 12 may be affected by the shielding effect of the through via 12 during polishing such that the chemical and mechanical interactions that take place during the CMP process will affect the through via 12 and the substrate 16 differently due to the difference in materials used to form the though via 12 (e.g., copper) and the substrate 16 (e.g., silicon). Therefore, the shielding effect may contribute to the shape of the tapered profile portion 18 surrounding the protruding through via 12.

In an embodiment, the substrate 16 is selectively planarized such that the width of the tapered profile portion 18 increases as the tapered profile portion 18 extends further away from the liner 14. In other words, the width of the apex of the tapered profile portion 18 is less than the width of the base of the tapered profile portion 18.

In an embodiment, the substrate 16 is selectively planarized such that the angle formed by the sidewall 34 of the liner 14 and an exterior surface 38 of the tapered profile portion 18 is greater than or equal to about thirty degrees (see FIG. 3). In an embodiment, the substrate 16 is selectively planarized such that the height h of the tapered profile portion 18 measured from the horizontal backside surface 24 of the substrate 16 to the apex 36 of the tapered profile portion 18 is greater than or equal to about forty percent of the height H of the liner 14 measured from the horizontal backside surface 24 of the substrate 16 to the backside surface 28 of the liner 14 (see FIG. 3).

The planarization process provides the substrate 16 with the horizontal backside surface 24 below the backside surface 26 of the through via 12. In other words, the planarization allows a portion of the through via 12 to protrude from the substrate 16.

Figure 4D:
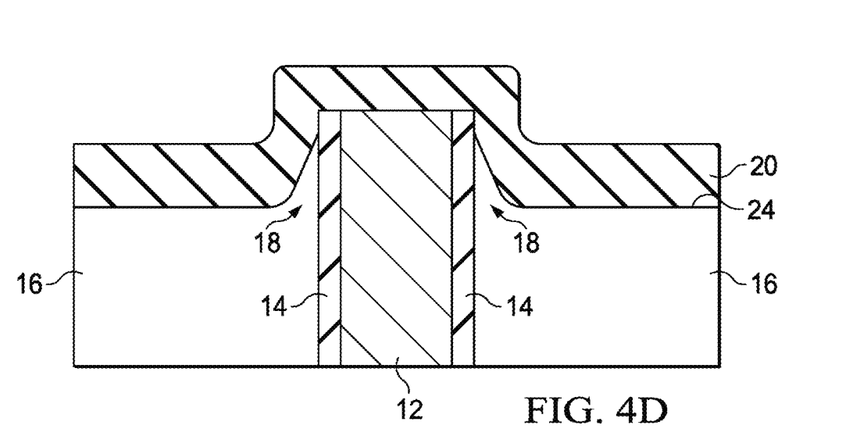

In FIG. 4D, the dielectric capping layer 20 is formed over the substrate 16, exposed portions of the liner 14, and the backside surface 26 of the through via 12. In accordance with some embodiments, the capping layer 20 is conformal with the underlying substrate 16, tapered profile portion 18, liner 14, and through via 12. In accordance with some embodiments, the capping layer 20 may be stepped proximate the through via as shown in FIG. 4D.

Figure 4E:
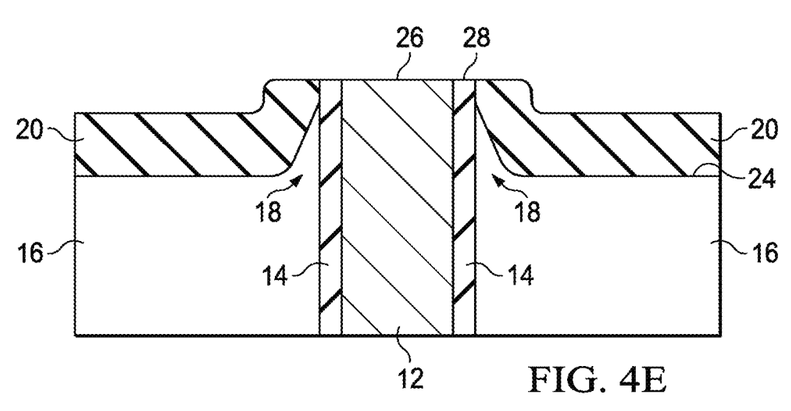

Next, in FIG. 4E, the dielectric capping layer 20 is planarized to expose the backside surface 26 of the through via 12. In an embodiment, the planarization process is a chemical mechanical polishing process. Even so, other processes or methods could be used to expose the through via 12 in accordance with some embodiments.

Figure 4F:
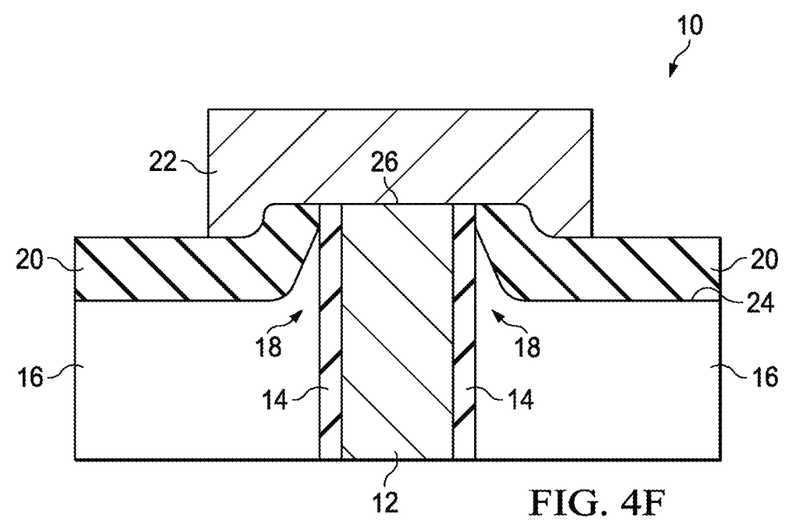

In FIG. 4F, the redistribution layer 22 is formed over the through via 12. As such, the redistribution layer 22 is electrically coupled to the through via 12. In an embodiment, the redistribution layer 22 is horizontally oriented while the through via 12 is vertically oriented.

From the foregoing, it should be recognized that the tapered profile portion 18 of the substrate 16 provides the interconnect structure 10 with numerous advantages and benefits. For example, the tapered profile portion 18 permits effective isolation of the redistribution layer 22 from the substrate 16 by reducing or preventing the formation of an undesirable leakage path (e.g., seams) in the isolation layer between the redistribution layer 22 and the substrate 16.

In an embodiment, an interconnect structure includes: a substrate having a first portion with a tapered surface and a second portion with a planar surface, an apex of the first portion being disposed a first height from the planar surface of the second portion, the first portion having a first width; a conductive via extending through the first portion of the substrate; a liner disposed between the conductive via and the substrate, the tapered surface of the substrate adjoining a sidewall of the liner; a dielectric capping layer disposed on the substrate and adjoining the sidewall of the liner, surfaces of the dielectric capping layer, the liner, and the conductive via being level; and a redistribution layer on the surfaces of the dielectric capping layer, the liner, and the conductive via, the redistribution layer being disposed a second height from the planar surface of the substrate, the second height being greater than the first height, the outermost extent of the redistribution layer being disposed a second width from the sidewall of the liner, the second width being greater than the first width.

In some embodiments of the interconnect structure, an angle formed by the sidewall of the liner and the tapered surface of the substrate is at least thirty degrees. In some embodiments of the interconnect structure, the first height is at least forty percent of the second height. In some embodiments of the interconnect structure, the conductive via and the liner extend from a front side of the substrate to a back side of the substrate. In some embodiments of the interconnect structure, the dielectric capping layer has a first portion adjoining the tapered surface of the substrate and a second portion adjoining the planar surface of the substrate, a first surface of the first portion being disposed the second height from the planar surface of the substrate, a second surface of the second portion being disposed a third height from the planar surface of the substrate, the third height being less than the second height. In some embodiments of the interconnect structure, the redistribution layer adjoins the first surface of the first portion of the dielectric capping layer and the second surface of the second portion of the dielectric capping layer. In some embodiments of the interconnect structure, a transition from the tapered surface of the substrate to the planar surface of the substrate is curved. In some embodiments of the interconnect structure, a transition from the tapered surface of the substrate to the planar surface of the substrate is linear.

In an embodiment, an interconnect structure includes: a substrate having a tapered profile portion, the tapered profile portion extending a first height above a major surface of the substrate; a conductive via protruding from the substrate; a liner interposed between the conductive via and the tapered profile portion of the substrate, a surface of the liner being level with a surface of the conductive via, the surfaces of the liner and the conductive via being disposed a second height above the major surface of the substrate, the second height being greater than the first height; and a redistribution layer on the surfaces of the liner and the conductive via, a first width extending from the liner to the outermost extent of the tapered profile portion of the substrate being less than a second width extending from the liner to the outermost extent of the redistribution layer.

In some embodiments of the interconnect structure, an angle formed by a sidewall of the liner and an exterior surface of the tapered profile portion is at least thirty degrees. In some embodiments of the interconnect structure, the first height is at least forty percent of the second height. In some embodiments of the interconnect structure, the conductive via and the liner extend from a front side of the substrate to a back side of the substrate. In some embodiments, the interconnect structure further includes: a dielectric capping layer disposed between the redistribution layer and the substrate, the dielectric capping layer having a first portion adjoining the tapered profile portion of the substrate and a second portion adjoining the major surface of the substrate, the first portion having a first surface disposed the first height above the major surface of the substrate, the second portion having a second surface disposed a third height above the major surface of the substrate, the third height being less than the second height. In some embodiments of the interconnect structure, the third height is less than the first height. In some embodiments of the interconnect structure, the first surface of the first portion of the dielectric capping layer is level with the surfaces of the liner and the conductive via. In some embodiments of the interconnect structure, the tapered profile portion has a curved exterior surface. In some embodiments of the interconnect structure, the tapered profile portion has an angled exterior surface.

In an embodiment, an interconnect structure includes: a substrate having a flat profile portion and a tapered profile portion; a conductive via extending through the tapered profile portion of the substrate; a liner disposed between the conductive via and the tapered profile portion of the substrate, the tapered profile portion of the substrate being disposed between the liner and the flat profile portion of the substrate; and a dielectric capping layer having a first portion disposed on the flat profile portion of the substrate and a second portion disposed on the tapered profile portion of the substrate, the first portion having a first thickness, the second portion having a second thickness, the second thickness being greater than the first thickness, surfaces of the conductive via, the liner, and the second portion of the dielectric capping layer being level.

In some embodiments, the interconnect structure further includes: a redistribution layer on the surfaces of the conductive via, the liner, and the second portion of the dielectric capping layer. In some embodiments of the interconnect structure, a first distance extending from a sidewall of the liner to an outermost extent of the tapered profile portion is less than a second distance extending from the sidewall of the liner to an outermost extent of the second portion of the dielectric capping layer, and a third distance extending from a major surface of the flat profile portion to an apex of the tapered profile portion is less than a fourth distance extending from the major surface of the flat profile portion to the redistribution layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An interconnect structure comprising:
   a substrate having a first portion with a tapered surface and a second portion with a planar surface, an apex of the first portion being disposed a first height from the planar surface of the second portion, the first portion having a first width;
   a conductive via extending through the first portion of the substrate;
   a liner disposed between the conductive via and the substrate, the tapered surface of the substrate adjoining a sidewall of the liner;
   a dielectric capping layer disposed on the substrate and adjoining the sidewall of the liner, surfaces of the dielectric capping layer, the liner, and the conductive via being planar; and
   a redistribution layer on the surfaces of the dielectric capping layer, the liner, and the conductive via, the redistribution layer being disposed a second height from the planar surface of the substrate, the second height being greater than the first height, the planar surface of the dielectric capping layer having a second width, the second width being greater than the first width.

2. The interconnect structure of claim 1, wherein an angle formed by the sidewall of the liner and the tapered surface of the substrate is at least thirty degrees.

3. The interconnect structure of claim 1, wherein the first height is at least forty percent of the second height.

4. The interconnect structure of claim 1, wherein the conductive via and the liner extend from a front side of the substrate to a back side of the substrate.

5. The interconnect structure of claim 1, wherein the dielectric capping layer has a first portion adjoining the tapered surface of the substrate and a second portion adjoining the planar surface of the substrate, a first surface of the first portion being disposed the second height from the planar surface of the substrate, a second surface of the second portion being disposed a third height from the planar surface of the substrate, the third height being less than the second height.

6. The interconnect structure of claim 5, wherein the redistribution layer adjoins the first surface of the first portion of the dielectric capping layer and the second surface of the second portion of the dielectric capping layer.

7. The interconnect structure of claim 1, wherein a transition from the tapered surface of the substrate to the planar surface of the substrate is curved.

8. The interconnect structure of claim 7, wherein the tapered surface of the substrate has a linear segment connecting the transition to the liner.

9. An interconnect structure comprising:
   a substrate having a tapered profile portion, the tapered profile portion extending a first height above a major surface of the substrate;
   a conductive via protruding from the substrate;

a liner interposed between the conductive via and the tapered profile portion of the substrate, a surface of the liner being planar with a surface of the conductive via, the surfaces of the liner and the conductive via being disposed a second height above the major surface of the substrate, the second height being greater than the first height;

and a redistribution layer, the redistribution layer being a single conductive material layer extending continuously across entireties of the surfaces of the liner and the conductive via, wherein a first width extending from the liner to the outermost extent of the tapered profile portion of the substrate is less than a second width extending from the liner to the outermost extent of the redistribution layer.

10. The interconnect structure of claim 9, wherein an angle formed by a sidewall of the liner and an exterior surface of the tapered profile portion is at least thirty degrees.

11. The interconnect structure of claim 9, wherein the first height is at least forty percent of the second height.

12. The interconnect structure of claim 9, wherein the conductive via and the liner extend from a front side of the substrate to a back side of the substrate.

13. The interconnect structure of claim 9 further comprising:
a dielectric capping layer disposed between the redistribution layer and the substrate, the dielectric capping layer having a first portion adjoining the tapered profile portion of the substrate and a second portion adjoining the major surface of the substrate, the first portion having a first surface disposed the second height above the major surface of the substrate, the second portion having a second surface disposed a third height above the major surface of the substrate, the third height being less than the second height.

14. The interconnect structure of claim 13, wherein the third height is less than the first height.

15. The interconnect structure of claim 13, wherein the first surface of the first portion of the dielectric capping layer is level with the surfaces of the liner and the conductive via.

16. The interconnect structure of claim 9, wherein the tapered profile portion has a curved exterior surface.

17. The interconnect structure of claim 9, wherein the tapered profile portion has an angled exterior surface.

18. An interconnect structure comprising:
a substrate having a flat profile portion and a tapered profile portion;
a conductive via extending through the tapered profile portion of the substrate;
a liner disposed between the conductive via and the tapered profile portion of the substrate, the tapered profile portion of the substrate being disposed between the liner and the flat profile portion of the substrate; and
a dielectric capping layer having a first portion disposed on the flat profile portion of the substrate and a second portion disposed on the tapered profile portion of the substrate, the first portion having a first thickness, the second portion having a second thickness, the second thickness being greater than the first thickness, surfaces of the conductive via, the liner, and the second portion of the dielectric capping layer being planar, wherein a first distance extending from a sidewall of the liner to an outermost extent of the tapered profile portion is less than a second distance extending from the sidewall of the liner to an outermost extent of the planar surface of the second portion of the dielectric capping layer.

19. The interconnect structure of claim 18 further comprising:
a redistribution layer on the planar surfaces of the conductive via, the liner, and the second portion of the dielectric capping layer.

20. The interconnect structure of claim 19, wherein a third distance extending from a major surface of the flat profile portion to an apex of the tapered profile portion is less than a fourth distance extending from the major surface of the flat profile portion to the redistribution layer.

* * * * *